(12) United States Patent
Yui et al.

(10) Patent No.: US 9,480,191 B2
(45) Date of Patent: Oct. 25, 2016

(54) ELECTRONIC APPARATUS HAVING INTEGRATED SHIELDING FILM

(71) Applicant: FUJITSU LIMITED, Kawasaki-shi, Kanagawa (JP)

(72) Inventors: Yasushi Yui, Kawasaki (JP); Shuuhei Fujita, Kawasaki (JP); Shinichirou Okamoto, Yokohama (JP); Shinichirou Kouno, Machida (JP); Masaru Sugie, Hino (JP)

(73) Assignee: FUJITSU LIMITED, Kawasaki (JP)

( * ) Notice: Subject to any disclaimer, the term of this patent is extended or adjusted under 35 U.S.C. 154(b) by 305 days.

(21) Appl. No.: 14/027,345

(22) Filed: Sep. 16, 2013

(65) Prior Publication Data
US 2014/0078698 A1    Mar. 20, 2014

(30) Foreign Application Priority Data

Sep. 20, 2012   (JP) ................. 2012-206910

(51) Int. Cl.
*H05K 9/00*    (2006.01)

(52) U.S. Cl.
CPC .......... *H05K 9/0007* (2013.01); *H05K 9/0022* (2013.01)

(58) Field of Classification Search
CPC  H01L 23/552; H05K 9/0009; H05K 9/0016; H05K 9/0045; H05K 9/0032; H05K 9/003
See application file for complete search history.

(56) References Cited

U.S. PATENT DOCUMENTS

| | | | |
|---|---|---|---|
| 2001/0036684 A1* | 11/2001 | Kitade | H05K 3/3405 438/106 |
| 2002/0024120 A1* | 2/2002 | Yoshimatsu | H01L 23/552 257/659 |
| 2006/0067070 A1* | 3/2006 | Otsuki | H01L 23/5387 361/816 |
| 2010/0000755 A1* | 1/2010 | Yui | B29C 45/14639 174/50 |
| 2011/0155445 A1* | 6/2011 | Kwon | H04B 15/04 174/384 |
| 2012/0020039 A1* | 1/2012 | Coffy | H01L 23/3128 361/760 |
| 2012/0104571 A1* | 5/2012 | Yoo | H01L 23/552 257/659 |
| 2012/0126347 A1* | 5/2012 | Yang | B81B 7/0064 257/416 |
| 2012/0140423 A1* | 6/2012 | Fisher, Jr. | H05K 3/284 361/748 |
| 2013/0027255 A1* | 1/2013 | Ito | H05K 9/0022 343/702 |
| 2014/0247564 A1* | 9/2014 | Shi | H01L 23/4093 361/720 |
| 2015/0022986 A1* | 1/2015 | Steuer | H05K 9/0022 361/767 |

FOREIGN PATENT DOCUMENTS

JP    2001-185889 A    7/2001
JP    2003-209390 A    7/2003

* cited by examiner

*Primary Examiner* — Courtney Smith
*Assistant Examiner* — Keith Depew
(74) *Attorney, Agent, or Firm* — Squire Patton Boggs (US) LLP

(57) ABSTRACT

An electronic apparatus includes: a casing; a conductive film disposed on an inner surface of the casing, the conductive film having a recess in a surface thereof; a circuit board accommodated in the casing; a semiconductor device disposed on the circuit board; and a conductive frame fixed around the semiconductor device on the circuit board, the conductive frame being fitted in the recess.

8 Claims, 14 Drawing Sheets

ELECTRONIC APPARATUS HAVING INTEGRATED SHIELDING FILM

CROSS-REFERENCE TO RELATED APPLICATION

This application is based upon and claims the benefit of priority of the prior Japanese Patent Application No. 2012-206910, filed on Sep. 20, 2012, the entire contents of which are incorporated herein by reference.

FIELD

The embodiments discussed herein are related to electronic apparatuses.

BACKGROUND

Electronic apparatuses such as personal computers incorporate semiconductor devices that operate at radio frequencies, for example, for improved processing speeds. During operation at radio frequencies, the semiconductor devices emit electromagnetic radiation, which might cause other electronic components to malfunction.

Accordingly, a shield is often provided around a semiconductor device to shield electromagnetic radiation emitted by the semiconductor device.

The shield, however, may increase the size of electronic apparatuses and thus make it difficult to reduce the size of electronic apparatuses. It is also desirable to improve the shielding effect of the shield against electromagnetic radiation.

The related art is disclosed in, for example, Japanese Laid-open Patent Publication Nos. 2001-185889 and 2003-209390.

SUMMARY

According to an aspect of the invention, an electronic apparatus includes: a casing; a conductive film disposed on an inner surface of the casing, the conductive film having a recess in a surface thereof; a circuit board accommodated in the casing; a semiconductor device disposed on the circuit board; and a conductive frame fixed around the semiconductor device on the circuit board, the conductive frame being fitted in the recess.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Prior to the description of embodiments, a preliminary matter that provides a basis for the embodiments will be described.

Figure 1:
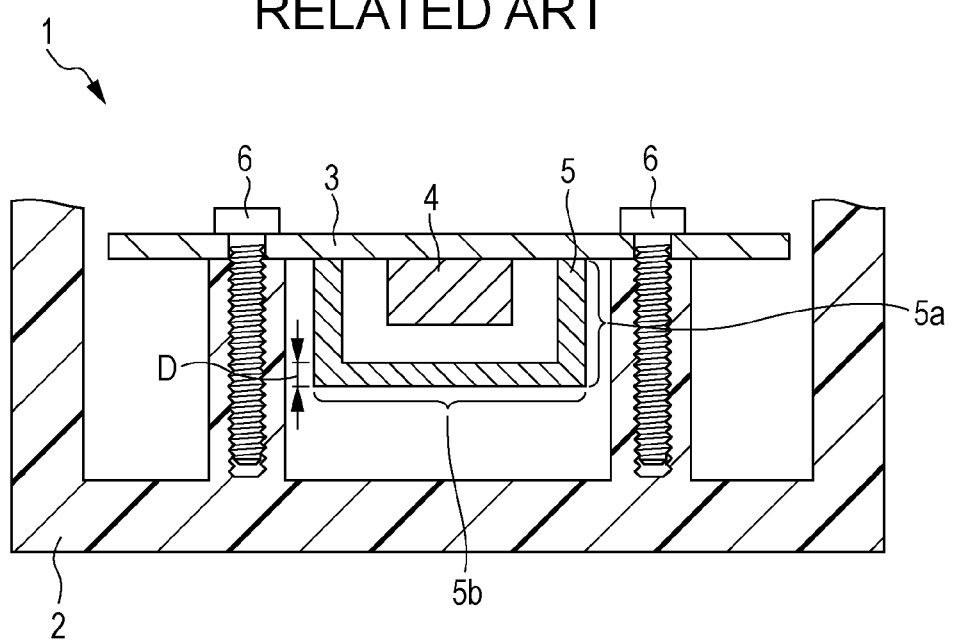
FIG. 1 is a sectional view of an electronic apparatus according to a preliminary matter.

FIG. 1 is a sectional view of an electronic apparatus according to the preliminary matter.

An electronic apparatus 1 includes a casing 2 formed by molding a resin, a circuit board 3, and a semiconductor device 4 disposed on the circuit board 3. The circuit board 3 is fixed to the casing 2 with screws 6.

The semiconductor device 4 is a device that operates at a radio frequency, for example, a central processing unit (CPU), a microprocessor unit (MPU), a graphics processing unit (GPU), a video graphics array (VGA) device, or an extended graphics array (XGA) device.

During operation at a radio frequency, the semiconductor device 4 emits electromagnetic radiation. To reduce the influence of the electromagnetic radiation on other electronic components, a metal shield 5 is disposed around the semiconductor device 4 on the circuit board 3.

The shield 5 includes side plates 5a fixed to the circuit board 3 and a top plate 5b covering the semiconductor device 4 from therebelow.

The thickness D of the top plate 5b makes it difficult to reduce the size of the electronic apparatus 1 in the thickness direction of the circuit board 3.

The embodiments will now be described.

First Embodiment

Figure 2:
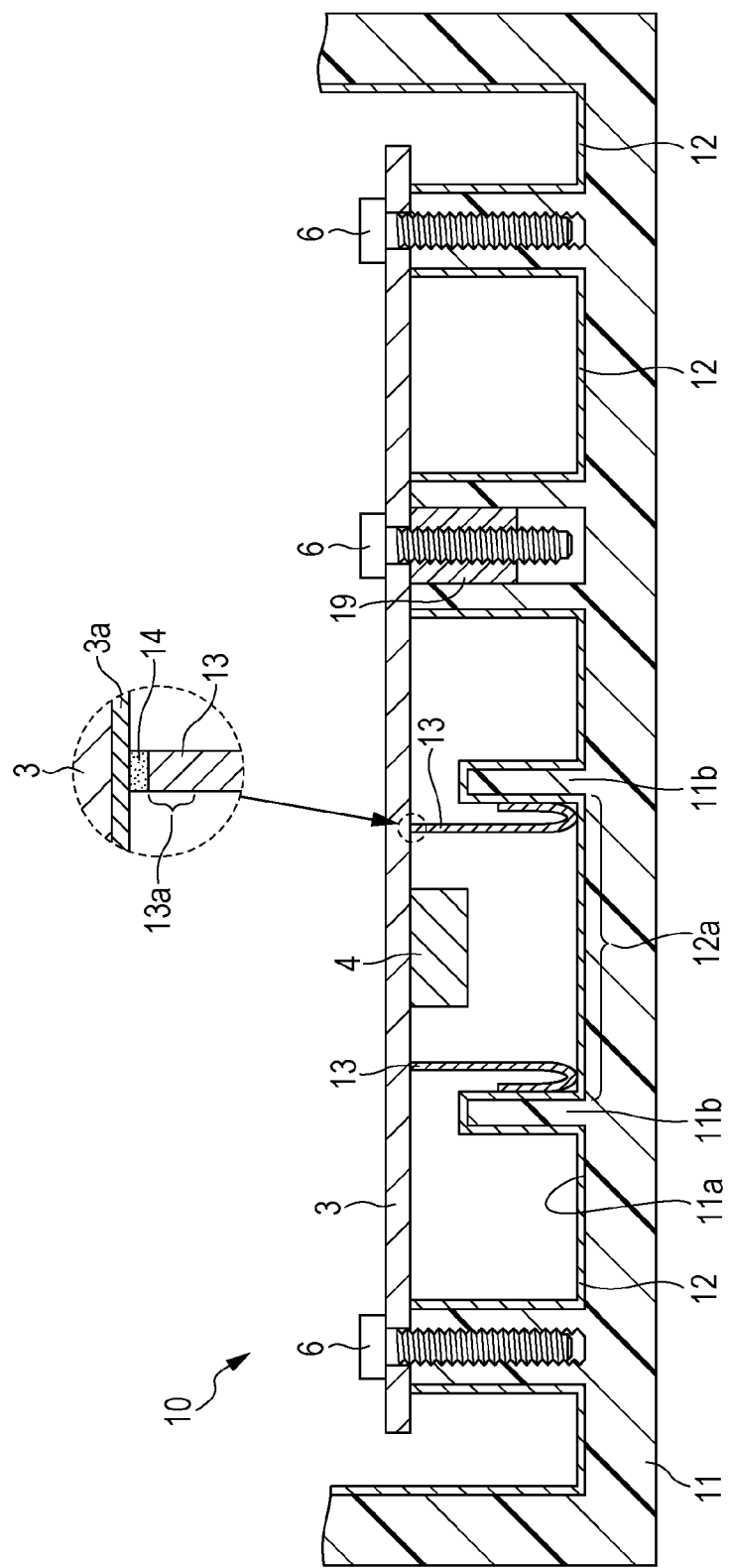
FIG. 2 is a sectional view of an electronic apparatus according to a first embodiment.

FIG. 2 is a sectional view of an electronic apparatus according to this embodiment. In FIG. 2, the same elements as in FIG. 1 are indicated by the same references as in FIG. 1 and are not described in detail herein.

As illustrated in FIG. 2, an electronic apparatus 10 includes a casing 11 formed by molding a resin, a circuit board 3 accommodated in the casing 11, and a semiconductor device 4 disposed on the circuit board 3. The circuit board 3 is fixed to the casing 11 with screws 6.

Some of the screws 6 are tapping screws drilled into the casing 11, and the other screws 6 are threaded into inserts 19 embedded in the casing 11. Instead of using these two types of screws 6, either type of screw 6 may be used.

The screws 6 and the inserts 19 may be formed of any material. In this embodiment, the screws 6 and the inserts 19 are formed of a conductive material such as aluminum or stainless steel.

The casing 11 is formed by molding a resin. The casing 11 may be formed of, for example, polycarbonate (PC), acrylonitrile-butadiene-styrene (ABS), polystyrene (PS), polyamide (PA), a blend of PA and ABS, polyethylene terephthalate (PET), polybutylene terephthalate (PBT), polyphenylene sulfide (PPS), or polylactic acid (PLA). The casing 11 may also be formed of polyetherimide (PEI), polyethylene adipate (PEA), polyether ether ketone (PEEK), polyethersulfone (PES), epoxy (EP), or polyethylene (PE). The casing 11 may also be formed of glass-fiber reinforced plastic (GFRP), carbon-fiber reinforced plastic (CFRP), or aramid-fiber reinforced plastic.

A conductive film 12 is disposed on an inner surface 11*a* of the casing 11. The conductive film 12 is deposited to a thickness of about 0.5 to 10 µm by electroplating, in which a current is supplied through a metal coating formed on the inner surface 11*a* of the casing 11 by electroless plating. The conductive film 12 may be formed of any material. In this embodiment, the conductive film 12 is formed of copper, aluminum, nickel, cobalt, chromium, tin, gold, silver, platinum, rhodium, iron, zinc, or an alloy thereof.

Instead of electroplating, the conductive film 12 may be formed by evaporation.

The casing 11 has a protrusion 11*b* on the inner surface 11*a* thereof. The protrusion 11*b* defines a recess 12*a* in the conductive film 12.

A conductive frame 13 is disposed around the semiconductor device 4 on the circuit board 3 so as to be in close contact with the conductive film 12. The frame 13 cooperates with the conductive film 12 to function as a shield for shielding electromagnetic radiation emitted by the semiconductor device 4. The frame 13 is fabricated by processing a metal sheet having a thickness of about 0.05 to 0.5 mm.

The metal sheet used for the frame 13 may be formed of, for example, copper, copper alloy, brass, phosphor bronze, beryllium copper, stainless steel, aluminum, titanium, magnesium, gold, silver, or platinum. The frame 13 may be formed of a metal coating, rather than a metal sheet. The metal coating may be, for example, a nickel coating, tin coating, chromium coating, gold coating, silver coating, platinum coating, or rhodium coating. Alternatively, the metal coating may be an alloy coating such as a solder coating, nickel-boron coating, nickel-chromium coating, silver-tin coating, gold-tin coating, nickel-phosphorus coating, nickel-cobalt coating, nickel-tin coating, or tin-cobalt coating.

The frame 13 may be fixed in any manner. In this embodiment, an end 13*a* of the frame 13 is fixed to a ground pattern 3*a* on the circuit board 3 with a conductive connection medium 14. The connection medium 14 may be, for example, a solder or silver paste.

The portion of the frame 13 fitted in the recess 12*a* is folded outward. This allows the frame 13 to deform elastically parallel to the circuit board 3.

Figure 3:
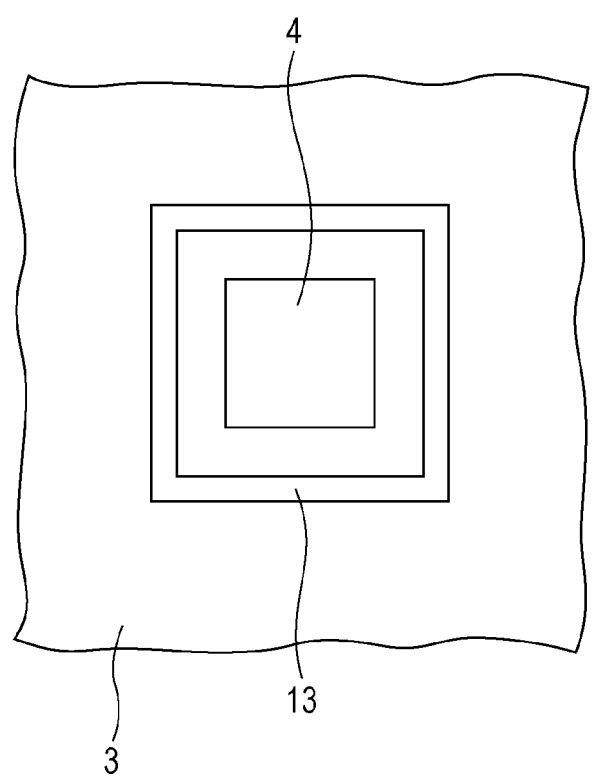
FIG. 3 is a plan view of a frame in the electronic apparatus according to the first embodiment.

FIG. 3 is a plan view of the frame 13.

As illustrated in FIG. 3, the frame 13 has a rectangular shape surrounding the semiconductor device 4.

Figure 4:
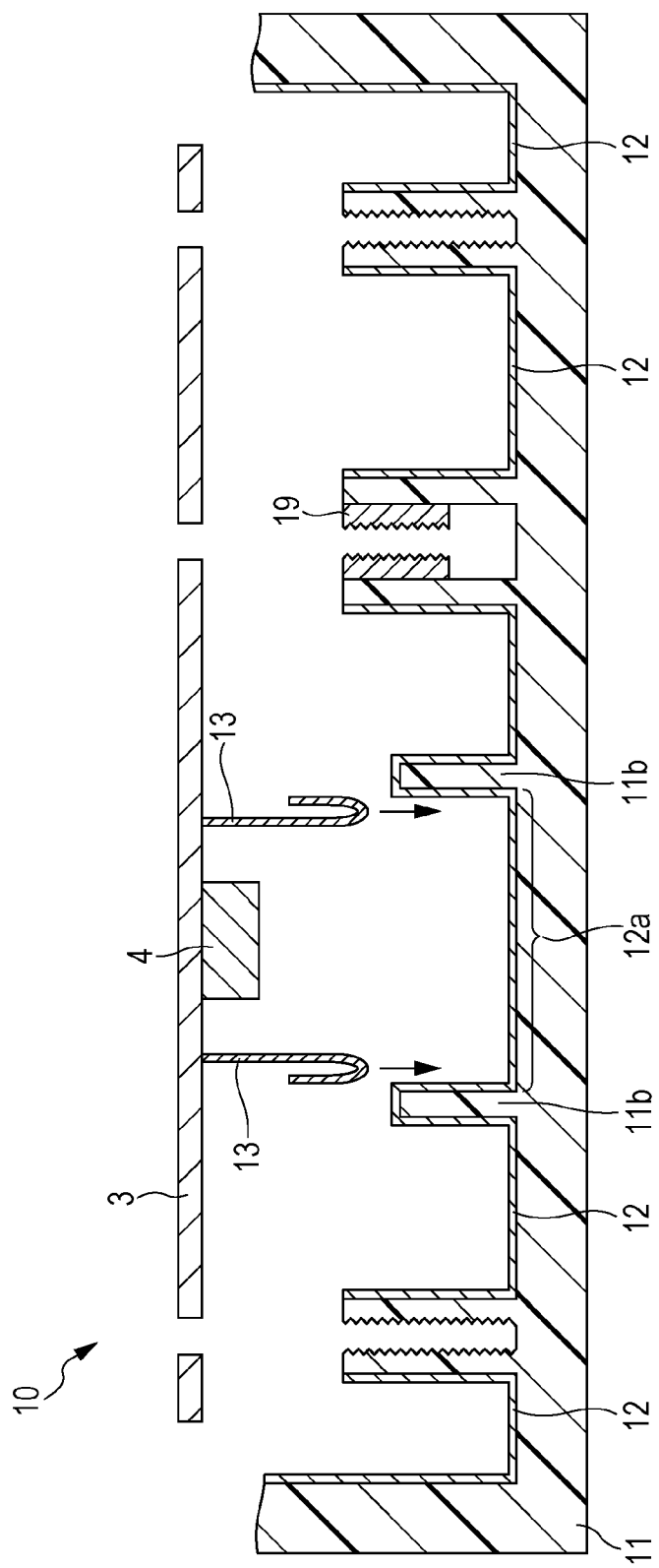
FIG. 4 is a sectional view illustrating how to attach a circuit board to a casing in the first embodiment.

FIG. 4 is a sectional view illustrating how to attach the circuit board 3 to the casing 11.

As illustrated in FIG. 4, the circuit board 3 is attached to the casing 11 by lowering the circuit board 3 toward the casing 11 and fitting the frame 13 in the recess 12*a*. During the attachment, the elasticity of the frame 13 ensures that it comes into close contact with the conductive film 12. This reduces the possibility of leakage of electromagnetic radiation emitted by the semiconductor device 4 between the frame 13 and the conductive film 12, thus reliably shielding the electromagnetic radiation.

According to the embodiment described above, as illustrated in FIG. 2, the conductive film 12 and the frame 13 shield electromagnetic radiation emitted by the semiconductor device 4. Unlike the case in FIG. 1, the frame 13 has no top plate. Accordingly, the size of the electronic apparatus 10 may be reduced by the thickness of the top plate. For example, if the top plate has a thickness of 0.2 mm, and the clearance between the top plate and the casing 11 is about 0.1 mm, the size of the electronic apparatus 10 may be reduced by about 0.3 mm (=0.2 mm+0.1 mm).

As illustrated in FIG. 4, the elasticity of the frame 13 ensures that it comes into close contact with the conductive film 12. This improves the shielding effect against electromagnetic radiation. The elasticity of the frame 13 also allows it to bend and absorb strain and deformation of the casing 11 during assembly of the electronic apparatus 10. This facilitates assembly of the electronic apparatus 10.

The conductive film 12 has a higher thermal conductivity than the resin casing 11. The conductive film 12 may therefore quickly diffuse heat over the casing 11, thus maintaining a uniform temperature distribution over the casing 11.

As illustrated in FIG. 2, the frame 13 is electrically connected to the ground pattern 3*a*. This reduces potential variation in the frame 13 so that the shield 22 may reliably shield electromagnetic radiation emitted by the semiconductor device 4. The frame 13 and the conductive film 12 connected thereto also function as a ground pattern, thus more reliably maintaining the ground pattern 3*a* at ground potential.

Second Embodiment

This embodiment improves the shielding effect against electromagnetic radiation as compared to the first embodiment in the following manner.

Figure 5:
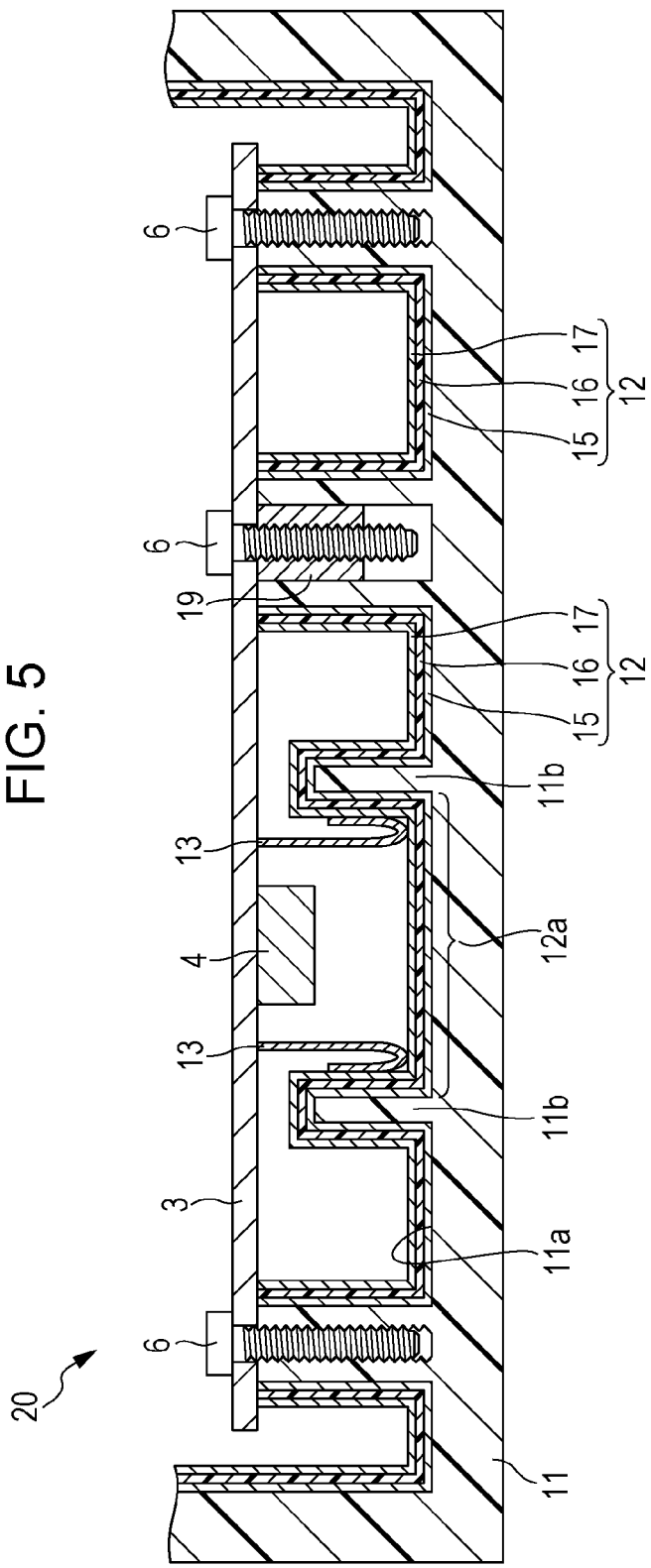
FIG. 5 is a sectional view of an electronic apparatus according to a second embodiment.

FIG. 5 is a sectional view of an electronic apparatus according to this embodiment. In FIG. 5, the same elements as in the first embodiment are indicated by the same references as in the first embodiment and are not described in detail herein.

As illustrated in FIG. 5, an electronic apparatus 20 according to this embodiment includes a multilayer conductive film 12 disposed on the inner surface 11*a* of the casing 11.

The multilayer conductive film 12 includes, in order from bottom to top, a first metal film 15, an insulating film 16, and a second metal film 17.

Among these films 15 to 17, the first metal film 15 and the second metal film 17 are deposited to a thickness of about 0.5 to 10 µm by electroplating, in which a current is supplied through a coating formed on the underlying surface by electroless plating.

The first metal film 15 and the second metal film 17 may be formed of any material. For example, these metal films 15 and 17 may be formed of aluminum, nickel, cobalt, chromium, tin, gold, silver, platinum, rhodium, iron, zinc, or an alloy thereof.

The insulating film 16 is deposited to a thickness of about 1 to 50 μm by spray-coating the first metal film 15 with an insulating resin or by dipping the first metal film 15 in an insulating resin.

The insulating film 16 may be formed of, for example, acrylic, epoxy, polyester, urethane, or a blend of acrylic and epoxy.

Because the first metal film 15 and the second metal film 17 are stacked with the insulating film 16 therebetween, the conductive film 12 has a larger metal film surface area than a single-layer metal film.

The shielding effect of the conductive film 12 against electromagnetic radiation emitted by the semiconductor device 4 increases with increasing metal film surface area of the conductive film 12. Thus, this embodiment improves the shielding effect of the conductive film 12 against electromagnetic radiation as compared to the first embodiment, which uses a single-layer metal film as the conductive film 12. According to calculations conducted by the inventors, the conductive film 12 has an attenuation of about 1 to 40 dB for electromagnetic radiation with frequencies of 100 to 1,000 MHz. This is equivalent to about two to four times the shielding effect of a single-layer metal film.

Third Embodiment

This embodiment improves the shielding effect of a conductive film against electromagnetic radiation in the following manner.

Figure 6:
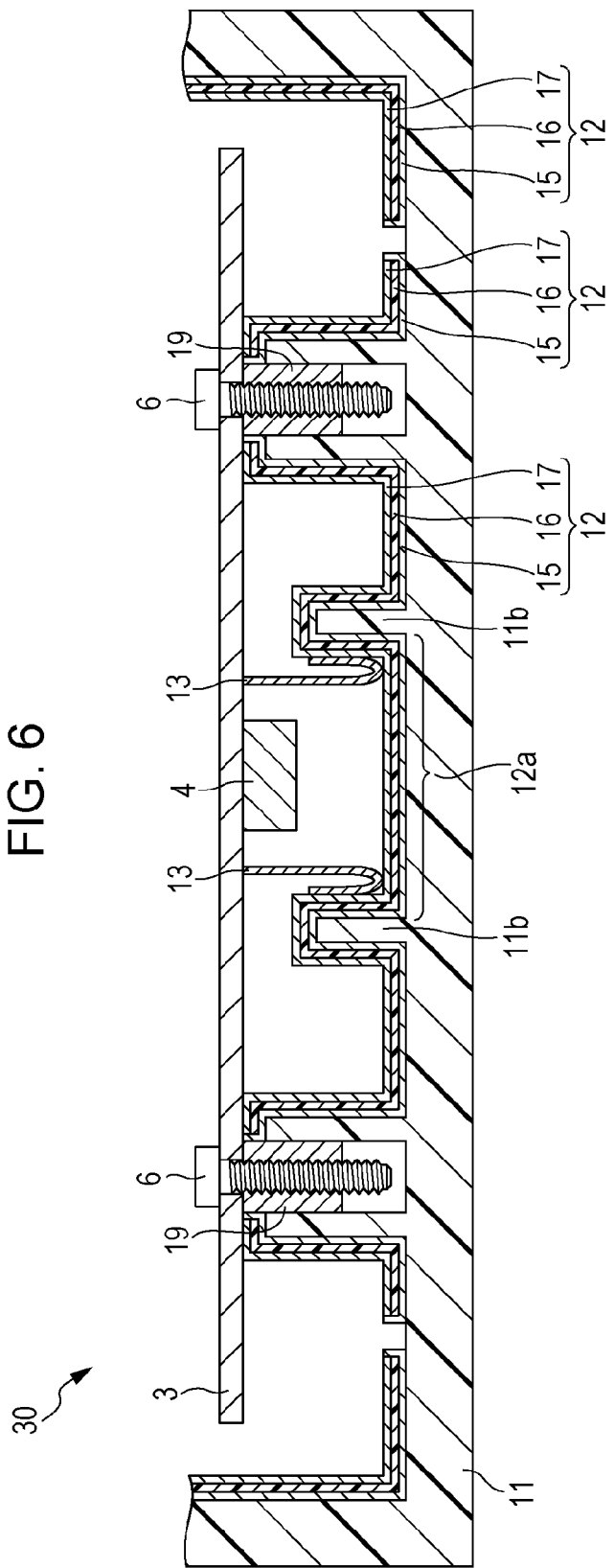
FIG. 6 is a sectional view of an electronic apparatus according to a third embodiment.

FIG. 6 is a sectional view of an electronic apparatus according to this embodiment. In FIG. 6, the same elements as in the second embodiment are indicated by the same references as in the second embodiment and are not described in detail herein.

As illustrated in FIG. 6, an electronic apparatus 30 includes a conductive film 12 extending to the outer surfaces of the conductive inserts 19. The conductive film 12 is electrically connected to the inserts 19 and the screws 6. This allows the inserts 19 and the screws 6 to shield electromagnetic radiation.

Figure 7:
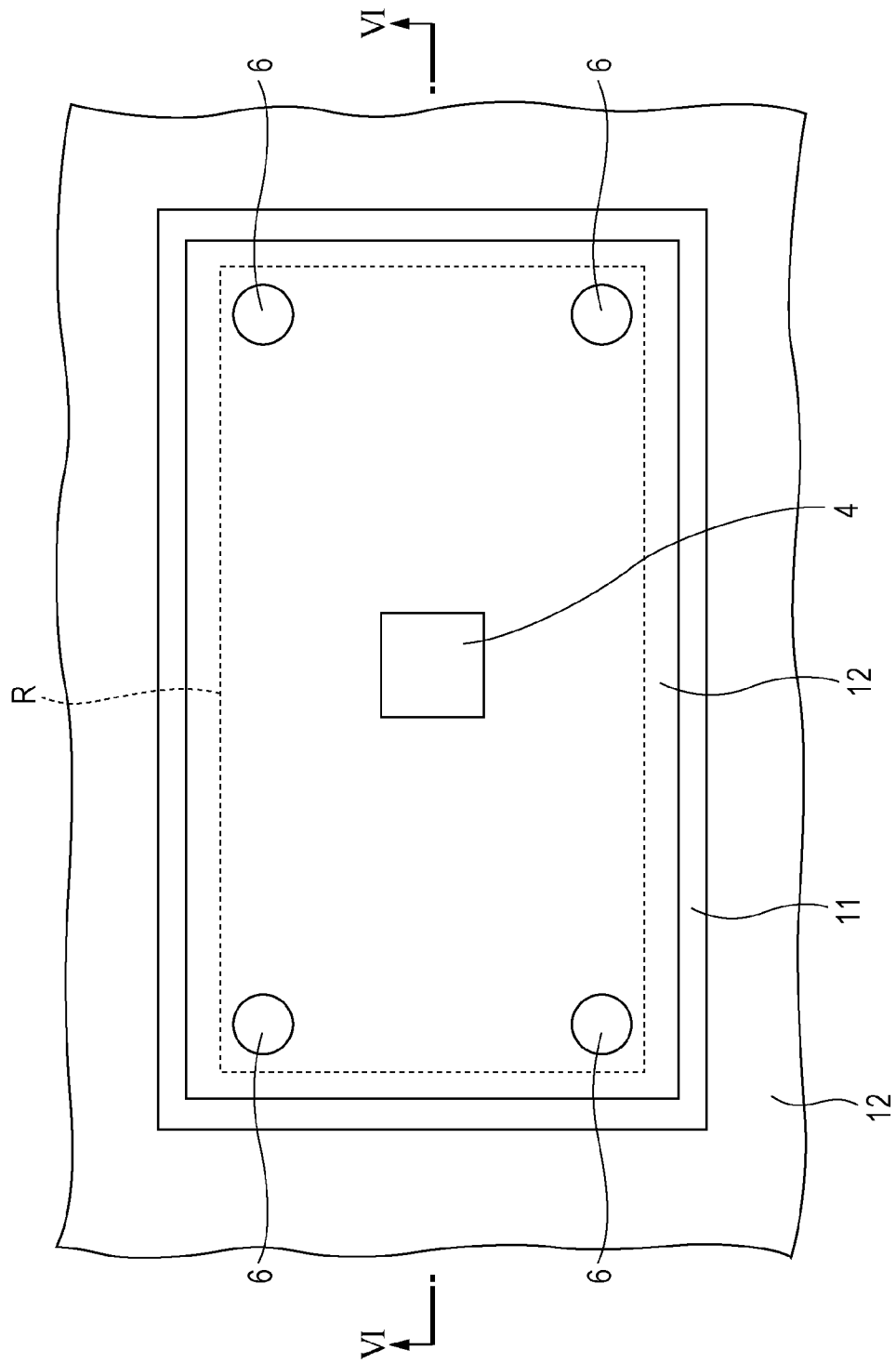
FIG. 7 is a plan view of a conductive film in the electronic apparatus according to the third embodiment.

FIG. 7 is a plan view of the conductive film 12, and FIG. 6 is a sectional view taken along line VI-VI in FIG. 7.

As illustrated in FIG. 7, a plurality of screws 6 are provided. The conductive film 12 is patterned in a rectangular shape extending beyond a region R in which the screws 6 and the semiconductor device 4 are located in plan view.

Because the conductive film 12 extends beyond the region R, the conductive film 12 has a larger metal film surface area than a conductive film 12 formed only within the region R. This improves the shielding effect of the conductive film 12 against electromagnetic radiation.

Although this embodiment illustrates a triple-layer conductive film 12, the conductive film 12 may be a single-layer metal film, as in first embodiment.

Fourth Embodiment

This embodiment shields electromagnetic radiation emitted by a semiconductor device in the following manner.

Figure 8:
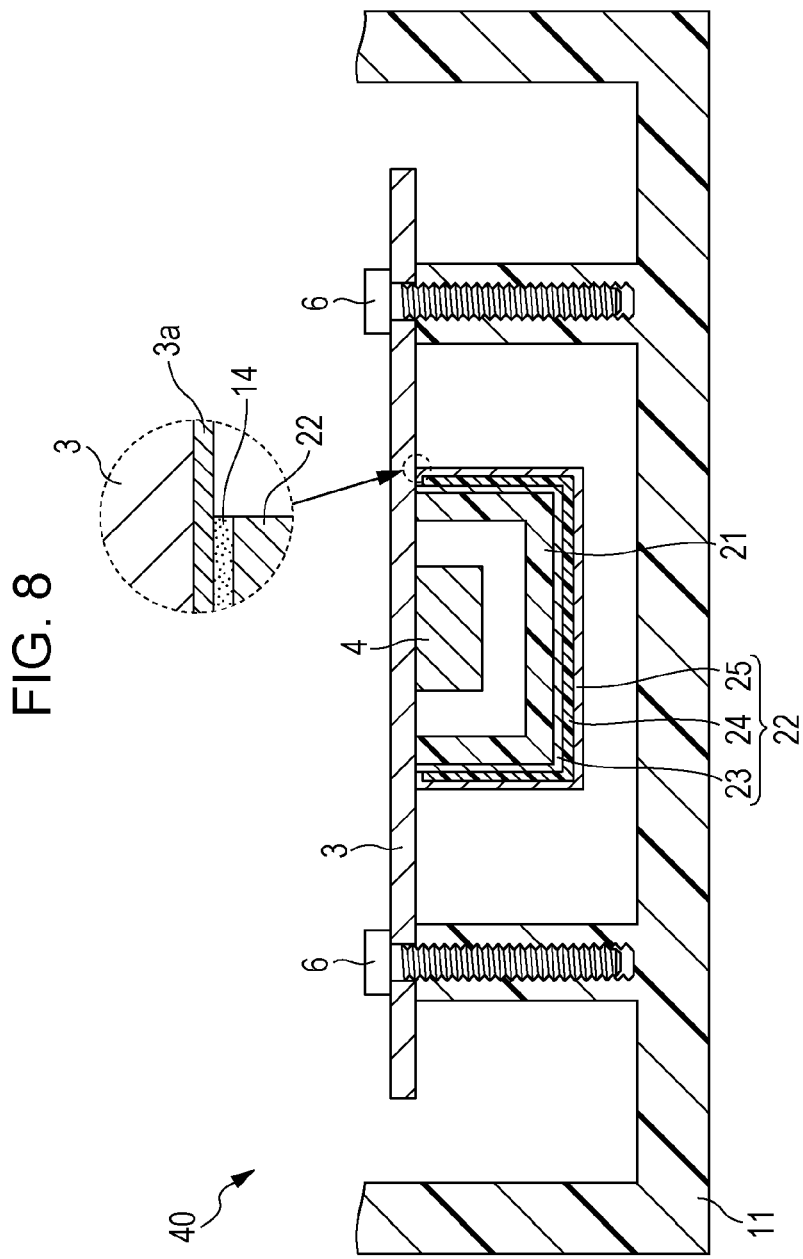
FIG. 8 is a sectional view of an electronic apparatus according to a fourth embodiment.

FIG. 8 is a sectional view of an electronic apparatus according to this embodiment. In FIG. 8, the same elements as in the first to third embodiments are indicated by the same references as in the first to third embodiments and are not described in detail herein.

As illustrated in FIG. 8, an electronic apparatus 40 includes a circuit board 3 and a semiconductor device 4 disposed on the circuit board 3.

A box 21 is fixed around the semiconductor device 4 on the circuit board 3 and surrounds the semiconductor device 4. A shield 22 is disposed on the outer surface of the box 21.

The box 21 is formed by molding a resin. The box 21 may be formed of, for example, PA or PPS.

The shield 22 functions to shield electromagnetic radiation emitted by the semiconductor device 4 and includes a first metal film 23, a first insulating film 24, and a second metal film 25 stacked in the above order.

Among these films 23 to 25, the first metal film 23 and the second metal film 25 are deposited to a thickness of about 0.5 to 10 μm by electroplating, in which a current is supplied through a coating formed on the underlying surface by electroless plating.

The first metal film 23 and the second metal film 25 may be formed of any material. For example, these metal films 23 and 25 may be formed of aluminum, nickel, cobalt, chromium, tin, gold, silver, platinum, rhodium, iron, zinc, or an alloy thereof.

The first insulating film 24 is deposited to a thickness of about 1 to 50 μm by spray-coating the first metal film 23 with an insulating resin or by dipping the first metal film 23 in an insulating resin.

The insulating film 24 may be formed of, for example, acrylic, epoxy, polyester, urethane, or a blend of acrylic and epoxy.

The box 21 and the shield 22 are bonded to the ground pattern 3a formed on the circuit board 3 with a conductive connection medium 14 such as a solder or silver paste.

The circuit board 3 is fixed to a casing 11 with screws 6, as in the first to third embodiments.

Because the shield 22 of the electronic apparatus 40 is composed of the first metal film 23 and the second metal film 25 stacked with the first insulating film 24 therebetween, the shield 22 has a larger metal film surface area than a shield 22 composed of a single-layer metal film. This improves the shielding effect of the shield 22 against electromagnetic radiation emitted by the semiconductor device 4.

Because the shield 22 is electrically connected to the ground pattern 3a on the circuit board 3, the shield 22 is maintained at ground potential. This reduces potential variation in the shield 22, thus further improving the shielding effect of the shield 22.

Although the embodiment in FIG. 8 illustrates a shield 22 disposed on the outer surface of the box 21, the shield 22 may be disposed at any position of the box 21.

Figure 9:
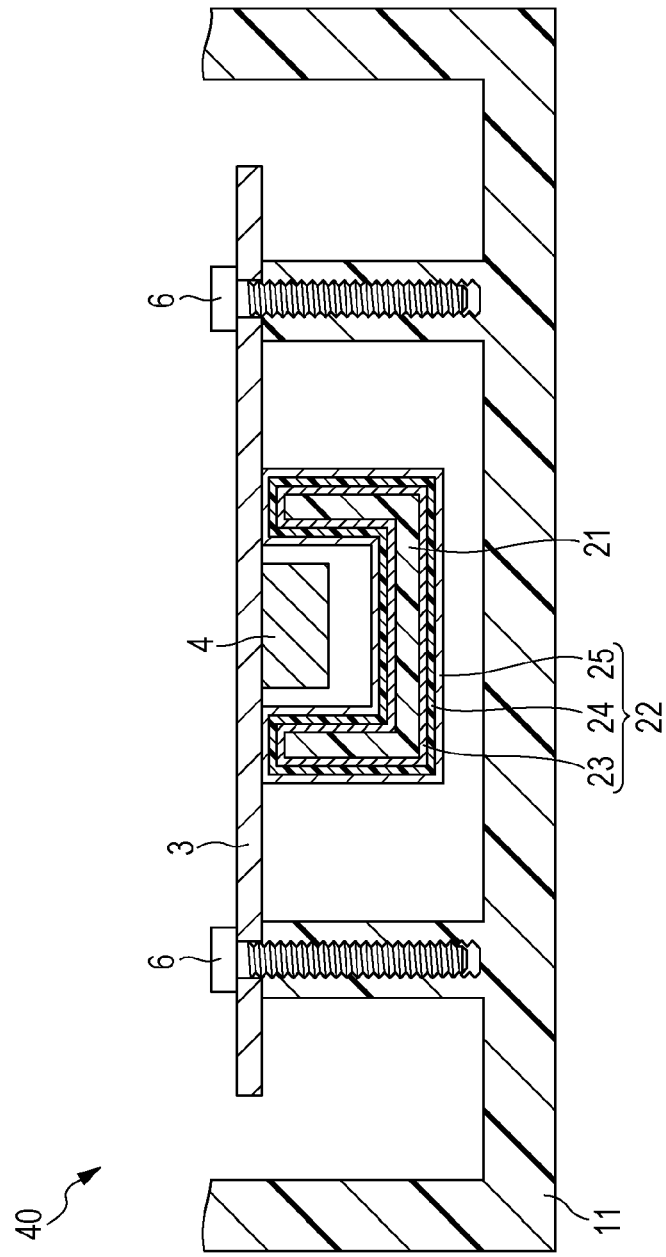
FIG. 9 is a sectional view illustrating a box having a shield on both of inner and outer surfaces thereof in the fourth embodiment.

For example, as illustrated in FIG. 9, the shield 22 may be disposed on both of the inner and outer surfaces of the box 21 to improve the shielding effect of the shield 22.

Figure 10:
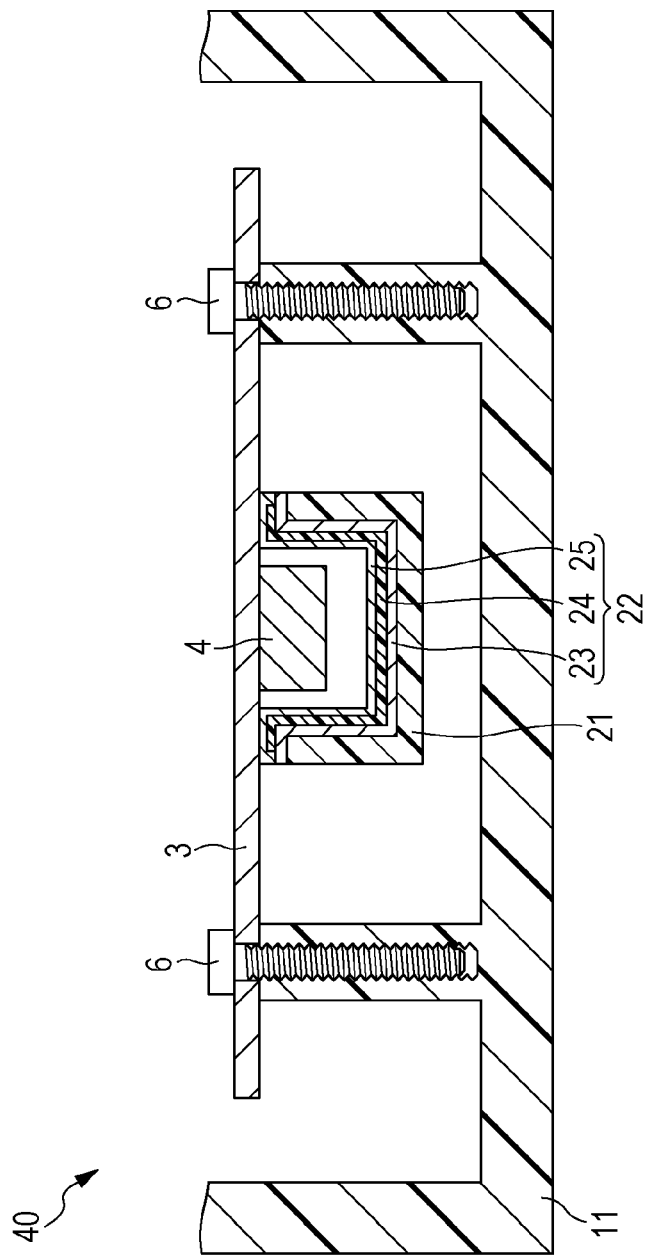
FIG. 10 is a sectional view illustrating a box having a shield on an inner surface thereof in the fourth embodiment.

Alternatively, as illustrated in FIG. 10, the shield 22 may be disposed on the inner surface of the box 21.

Fifth Embodiment

This embodiment improves the shielding effect against electromagnetic radiation as compared to the fourth embodiment.

Figure 11:
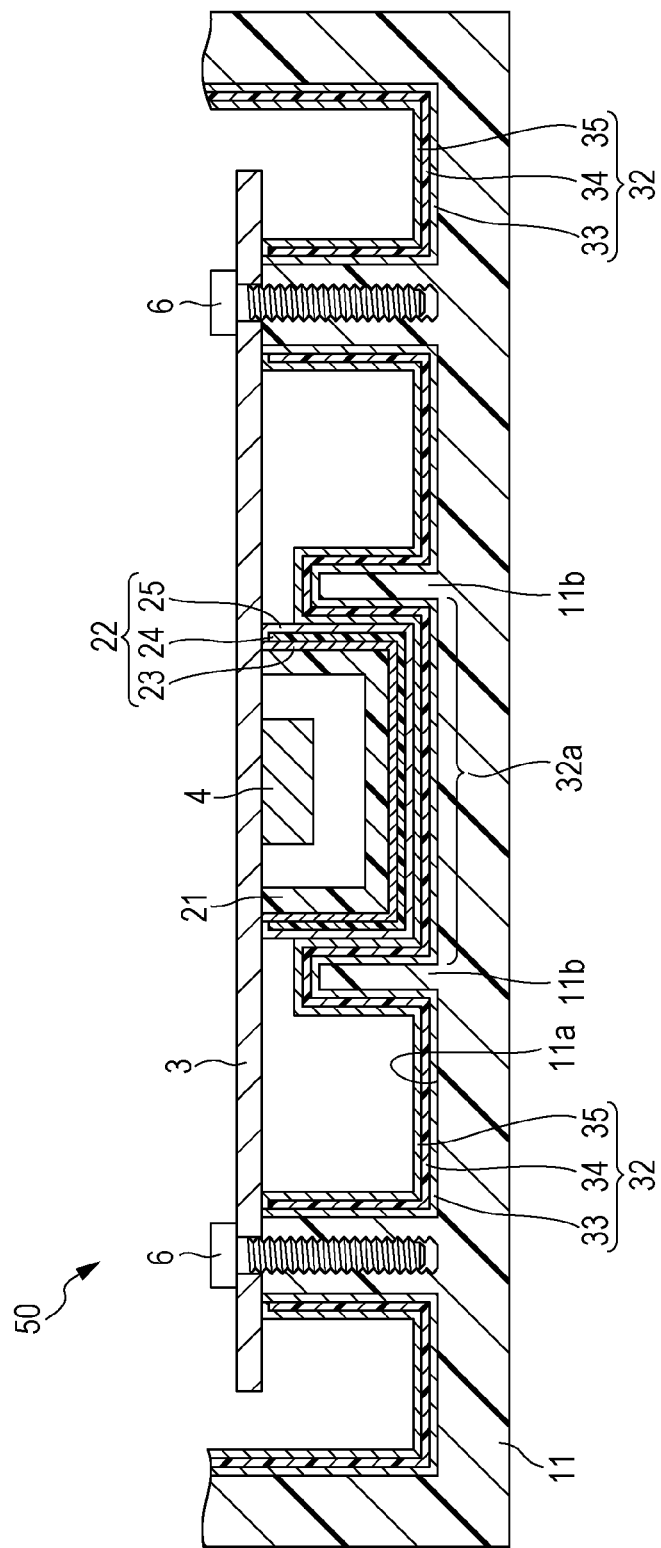
FIG. 11 is a sectional view of an electronic apparatus according to a fifth embodiment.

FIG. 11 is a sectional view of an electronic apparatus according to this embodiment. In FIG. 11, the same elements as in the fourth embodiment are indicated by the same references as in the fourth embodiment and are not described in detail herein.

As illustrated in FIG. 11, an electronic apparatus 50 includes a casing 11 having a protrusion 11b on an inner surface 11a thereof and also includes a conductive film 32 disposed on the inner surface 11a of the casing 11.

The conductive film 32 includes a third metal film 33, a second insulating film 34, and a fourth metal film 35 stacked in the above order and has a recess 32a defined by the protrusion 11b.

Among these films 33 to 35, the third metal film 33 and the fourth metal film 35 are deposited to a thickness of about 0.5 to 10 μm by electroplating, in which a current is supplied through a coating formed on the underlying surface by electroless plating.

The third metal film 33 and the fourth metal film 35 may be formed of any material. For example, these metal films 33 and 35 may be formed of aluminum, nickel, cobalt, chromium, tin, gold, silver, platinum, rhodium, iron, zinc, or an alloy thereof.

The second insulating film 34 is deposited to a thickness of about 1 to 50 μm by spray-coating the third metal film 33 with an insulating resin or by dipping the third metal film 33 in an insulating resin.

The second insulating film 34 may be formed of, for example, acrylic, epoxy, polyester, urethane, or a blend of acrylic and epoxy.

The shield 22 is fitted in the recess 32a in the conductive film 32 so as to be in close contact with the conductive film 32. To ensure that the shield 22 is electrically connected to the conductive film 32, they may be bonded together by providing a clearance of about 0.1 mm therebetween and filling the clearance with a silver paste.

Because the shield 22 of the electronic apparatus 50 is electrically connected to the conductive film 32, the conductive film 32 also shields electromagnetic radiation emitted by the semiconductor device 4. The electromagnetic radiation may therefore be more reliably shielded than in the fourth embodiment.

Because the conductive film 32 is composed of the third metal film 33 and the fourth metal film 35 stacked with the second insulating film 34 therebetween, the conductive film 32 has a larger metal film surface area. This improves the shielding effect of the conductive film 32.

Sixth Embodiment

Figure 12:
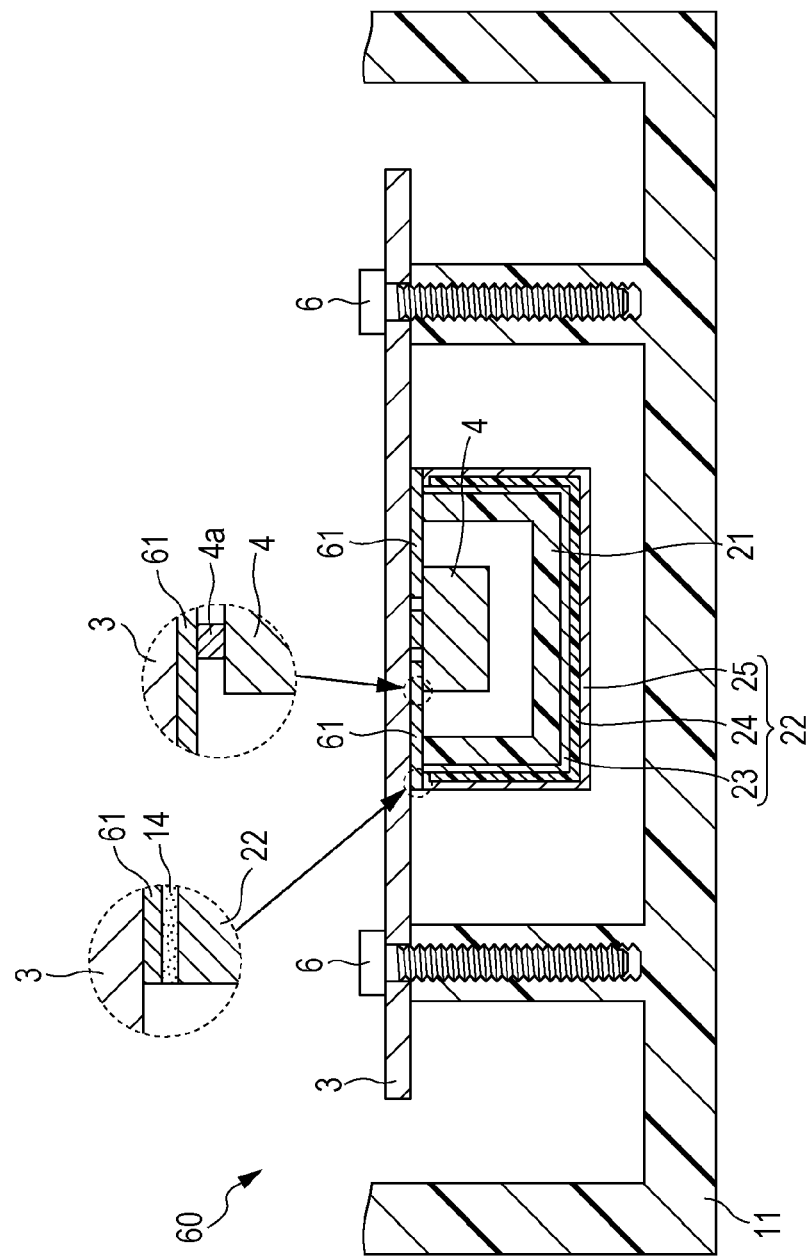
FIG. 12 is a sectional view of an electronic apparatus according to a sixth embodiment.

FIG. 12 is a sectional view of an electronic apparatus according to this embodiment. In FIG. 12, the same elements as in the fourth embodiment are indicated by the same references as in the fourth embodiment and are not described in detail herein.

As illustrated in FIG. 12, an electronic apparatus 60 includes a semiconductor device 4 having a ground terminal 4a. A lead 61 extends from the ground terminal 4a across a surface of the circuit board 3. The lead 61 is electrically connected to the shield 22 with a conductive connection medium 14.

Thus, the shield 22 is maintained at ground potential. This reduces potential variation in the shield 22 so that the shield 22 may reliably shield electromagnetic radiation emitted by the semiconductor device 4.

To ensure that the shield 22 is maintained at ground potential, the shield 22 and the lead 61 are preferably connected at two or more positions.

Seventh Embodiment

This embodiment illustrates examples of the casings of the electronic apparatuses illustrated in the first to sixth embodiments.

FIGS. 13A to 13C and FIGS. 14A and 14B are perspective views of casings of various electronic apparatuses to which the first to sixth embodiments are applicable.

Figure 13A:
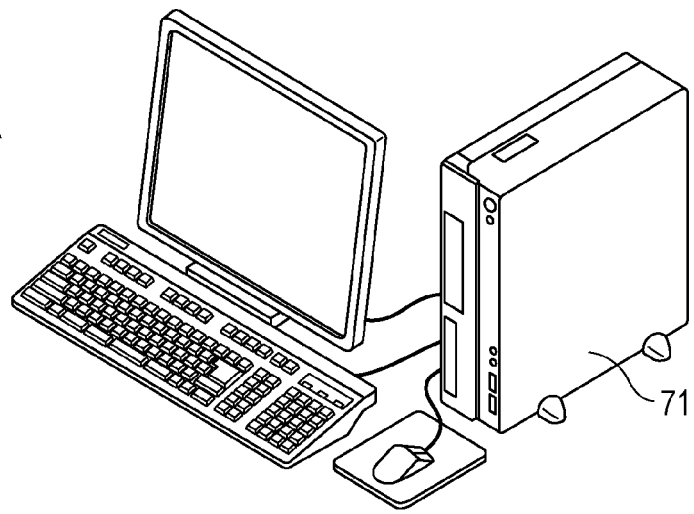
FIG. 13A is a perspective view of a casing of a desktop personal computer.
Figure 13B:
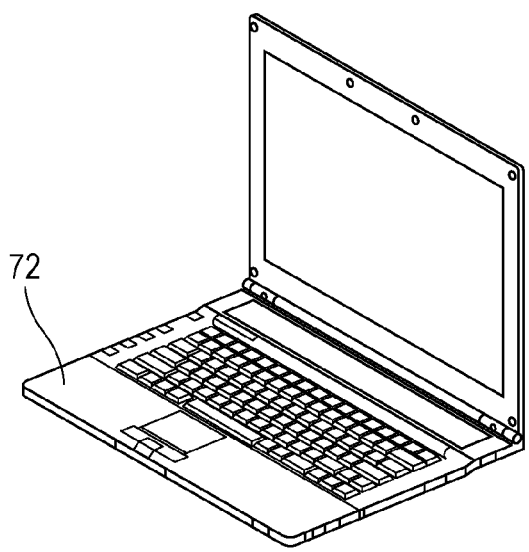
FIG. 13B is a perspective view of a casing of a notebook personal computer.
Figure 13C:
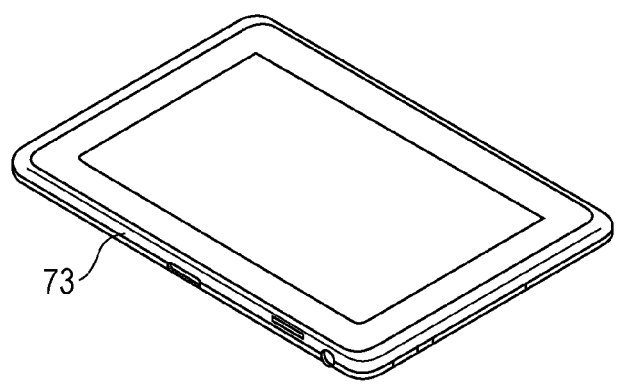
FIG. 13C is a perspective view of a casing of a tablet personal computer.

FIG. 13A illustrates a casing 71 of a desktop personal computer. FIG. 13B illustrates a casing 72 of a notebook personal computer. FIG. 13C illustrates a casing 73 of a tablet personal computer.

Figure 14A:
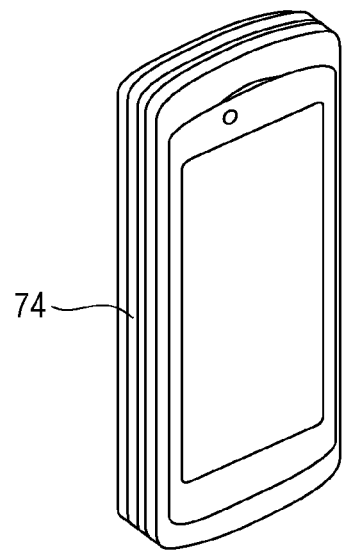
FIG. 14A is a perspective view of a casing of a smartphone.
Figure 14B:
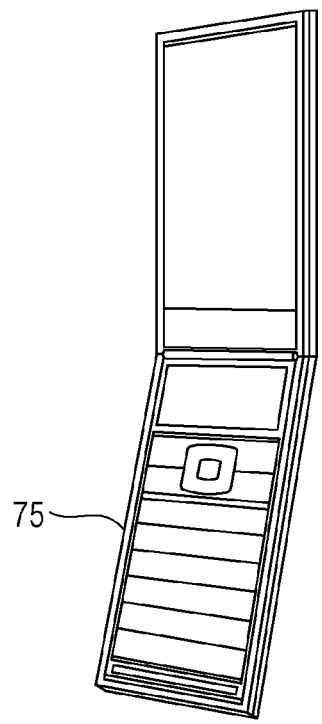
FIG. 14B is a perspective view of a casing of a collapsible cellular phone.

FIG. 14A illustrates a casing 74 of a smartphone. FIG. 14B illustrates a casing 75 of a collapsible cellular phone.

The first to sixth embodiments are applicable to any of the casings 71 to 75.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:
   a casing;
   a conductive film disposed on an inner surface of the casing, the conductive film having a recess in a surface thereof;
   a circuit board accommodated in the casing;
   a semiconductor device disposed on the circuit board so as to face the recess; and
   a conductive frame fixed around the semiconductor device on the circuit board, the conductive frame extending to the conductive film in the recess and being in contact with the conductive film at a bottom of the recess.

2. The electronic apparatus according to claim 1, wherein a portion of the conductive frame fitted in the recess is elastic.

3. The electronic apparatus according to claim 2, wherein the portion of the conductive frame fitted in the recess is folded outward.

4. The electronic apparatus according to claim 1, wherein the conductive film includes a first metal film, an insulating film disposed on the first metal film, and a second metal film disposed on the insulating film.

5. The electronic apparatus according to claim 1, further comprising
   a plurality of screws with which the circuit board is fixed to the casing,
   wherein the conductive film extends beyond a region in which the plurality of screws and the semiconductor device are located in plan view.

6. The electronic apparatus according to claim 1, wherein the casing comprises a resin.

7. The electronic apparatus according to claim 1, wherein the conductive frame has a first portion which is folded outward at the bottom of the recess.

8. The electronic apparatus according to claim 7, wherein a second portion of the conductive film which extends from the first portion outwardly is in contact with a sidewall of the recess.

* * * * *